(12) United States Patent
Al

(10) Patent No.: US 11,164,909 B1
(45) Date of Patent: Nov. 2, 2021

(54) DISPLAY PANEL, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Na Al, Shenzhen (CN)

( * ) Notice: Subject to any disclaimer, the term of this patent is extended or adjusted under 35 U.S.C. 154(b) by 204 days.

(21) Appl. No.: 16/625,779

(22) PCT Filed: Dec. 6, 2019

(86) PCT No.: PCT/CN2019/123459
§ 371 (c)(1),
(2) Date: Dec. 23, 2019

(87) PCT Pub. No.: WO2021/103103
PCT Pub. Date: Jun. 3, 2021

(30) Foreign Application Priority Data

Nov. 25, 2019 (CN) .......................... 201911163245.5

(51) Int. Cl.
*H01L 27/32* (2006.01)
*H01L 51/50* (2006.01)
*H01L 51/52* (2006.01)
*H01L 51/00* (2006.01)
*H01L 51/56* (2006.01)

(52) U.S. Cl.
CPC ...... *H01L 27/3211* (2013.01); *H01L 27/3246* (2013.01); *H01L 51/0005* (2013.01); *H01L 51/0021* (2013.01); *H01L 51/502* (2013.01); *H01L 51/5262* (2013.01); *H01L 51/56* (2013.01); *H01L 2227/323* (2013.01); *H01L 2251/308* (2013.01); *H01L 2251/5353* (2013.01); *H01L 2251/558* (2013.01)

(58) Field of Classification Search
CPC ............ H01L 27/3211; H01L 51/0021; H01L 51/502; H01L 27/3246
See application file for complete search history.

(56) References Cited

U.S. PATENT DOCUMENTS

2018/0376090 A1* 12/2018 Liu ...................... H04N 5/3575

* cited by examiner

*Primary Examiner* — Anthony Ho

(57) ABSTRACT

The present disclosure provides a display panel, a manufacturing method thereof, and a display device. The display panel comprises a plurality of sub-pixels, wherein a part is face-up sub-pixels and the rest is flip sub-pixels. In the face-up sub-pixels, a first electrode, a hole transport layer, a light-emitting layer, an electron transport layer, and a second electrode are disposed on a substrate in sequence, and in the flip sub-pixels, the first electrode, an electron transport layer, a light-emitting layer, a hole transport layer, and the second electrode are disposed on the substrate in sequence.

15 Claims, 3 Drawing Sheets

DISPLAY PANEL, MANUFACTURING METHOD THEREOF, AND DISPLAY DEVICE

The present application claims the benefit of the Chinese Patent Application: CN201911163245.5 filed on Nov. 25, 2019, and entitled "DISPLAY PANEL, MANUFACTURING METHOD THEREOF, AND DISPLAY DEVICE", which is incorporated herein by reference in its entirety.

FIELD OF INVENTION

The present disclosure relates to the field of display technologies, and more particularly, to a display panel, a manufacturing method thereof, and a display device.

BACKGROUND OF INVENTION

Organic light-emitting diodes (OLEDs) are also known as organic electroluminescent displays or organic light-emitting semiconductors. Since OLEDs have advantages of self-illumination, wide viewing angles, extremely high contrast, lower power consumption, and fast responses, they have become a research hotspot in current field of display technology.

Quantum dot light-emitting diodes (QLEDs) achieve the displaying by quantum dot electroluminescence. Compared to OLEDs, QLEDs have a longer service life, more saturated colors, thinner panel sizes, more streamlined manufacturing processes after technological improvements, and higher display resolution.

Integrating OLED devices and QLED devices into a same display device, and the manufactured complementary display device has advantages of a better color effect and lower power consumption.

Technical Problem an energy level of QLED device materials has a greater difference from an energy level of OLED device materials. How to achieve a higher efficiency and service life in a same display device is one of the important factors for improving performance of QLED/OLED hybrid display devices.

SUMMARY OF INVENTION

To solve the above problem, in a first aspect, an embodiment of the present disclosure provides a display panel. The display panel comprises a substrate, wherein a pixel definition layer is disposed on the substrate to define a plurality of sub-pixels arranged in an array, and in the plurality of sub-pixels, a part is face-up sub-pixels, and the rest is flip sub-pixels;

wherein in the face-up sub-pixels, a first electrode, a hole injection layer, a hole transport layer, a light-emitting layer, an electron transport layer, an electron injection layer, and a second electrode are disposed on the substrate in sequence, and in the flip sub-pixels, the first electrode, an electron injection layer, an electron transport layer, a light-emitting layer, a hole transport layer, a hole injection layer, and the second electrode are disposed on the substrate in sequence.

In an embodiment of the present disclosure, wherein in the face-up sub-pixels, the light-emitting layer is made of an organic luminescent material, and in the flip sub-pixels, the light-emitting layer is made of a quantum dot luminescent material.

In an embodiment of the present disclosure, wherein in the face-up sub-pixels, the first electrode is an anode and the second electrode is a cathode, and in the flip sub-pixels, the first electrode is a cathode, and the second electrode is an anode.

In an embodiment of the present disclosure, wherein the plurality of sub-pixels are divided into a plurality of pixels, any one of the pixels comprises at least three sub-pixels, and in the at least three sub-pixels, a part is the face-up sub-pixels and the rest is the flip sub-pixels.

In an embodiment of the present disclosure, wherein any one of the pixels comprises a red sub-pixel, a blue sub-pixel, and a green sub-pixel.

In an embodiment of the present disclosure, wherein any one of the red sub-pixel, the blue sub-pixel, and the green sub-pixel is a face-up sub-pixel and the other two are flip sub-pixels, or any two of the red sub-pixel, the blue sub-pixel, and the green sub-pixel are face-up sub-pixels and the other one is a flip sub-pixel.

In an embodiment of the present disclosure, the display panel further comprises an optical coupling output layer disposed on the second electrode.

In an embodiment of the present disclosure, wherein a thickness of the optical coupling output layer ranges from 50 nm to 100 nm.

In an embodiment of the present disclosure, wherein the first electrode is made of indium tin oxide.

In a second aspect, an embodiment of the present disclosure further provides a manufacturing method of a display panel. The method comprises:

S01: providing a substrate and forming a patterned first electrode on the substrate;

S02: forming a patterned pixel definition layer on the first electrode and exposing the patterned first electrode to form a plurality of sub-pixel regions;

S03: in a part of sub-pixel regions, disposing an electron injection layer, an electron transport layer, a light-emitting layer, a hole transport layer, and a hole injection layer on the first electrode in sequence;

S04: in the rest of sub-pixel regions, disposing a hole injection layer, a hole transport layer, a light-emitting layer, an electron transport layer, and an electron injection layer on the first electrode in sequence;

S05: forming a second electrode in the plurality of sub-pixel regions together.

In an embodiment of the present disclosure, wherein the hole injection layers, the hole transport layers, the light-emitting layers, the electron transport layers, and the electron injection layers are formed by inkjet printing.

In an embodiment of the present disclosure, wherein the second electrode is formed by vacuum vapor deposition.

In an embodiment of the present disclosure, wherein an optical coupling output layer is formed on the second electrode by vacuum vapor deposition.

In an embodiment of the present disclosure, wherein in the step S03, the light-emitting layer is made of a quantum dot luminescent material, and in the step S04, the light-emitting layer is made of an organic luminescent material.

In a third aspect, the present disclosure further provides a display device which comprises the above display panel.

Beneficial Effect:

the present disclosure provides a display panel by disposing face-up sub-pixels and flip sub-pixels according to light-emitting materials in each sub-pixel to make each sub-pixel have a higher efficiency and service life. Specifically, in a QLED/OLED hybrid display panel, QLED sub-pixels are disposed as flip sub-pixels, and OLED sub-pixels are disposed as face-up sub-pixels, thereby making each sub-pixel have a higher efficiency and service life.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
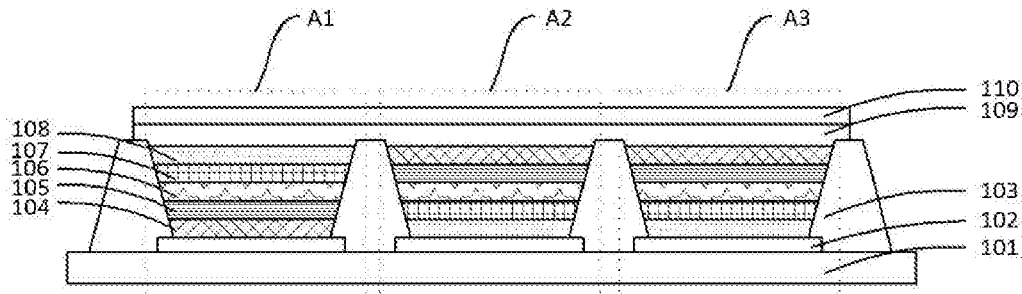
FIG. 1 is a schematic cross-sectional structural diagram of a display panel according to an embodiment of the present disclosure.
Figure 2:
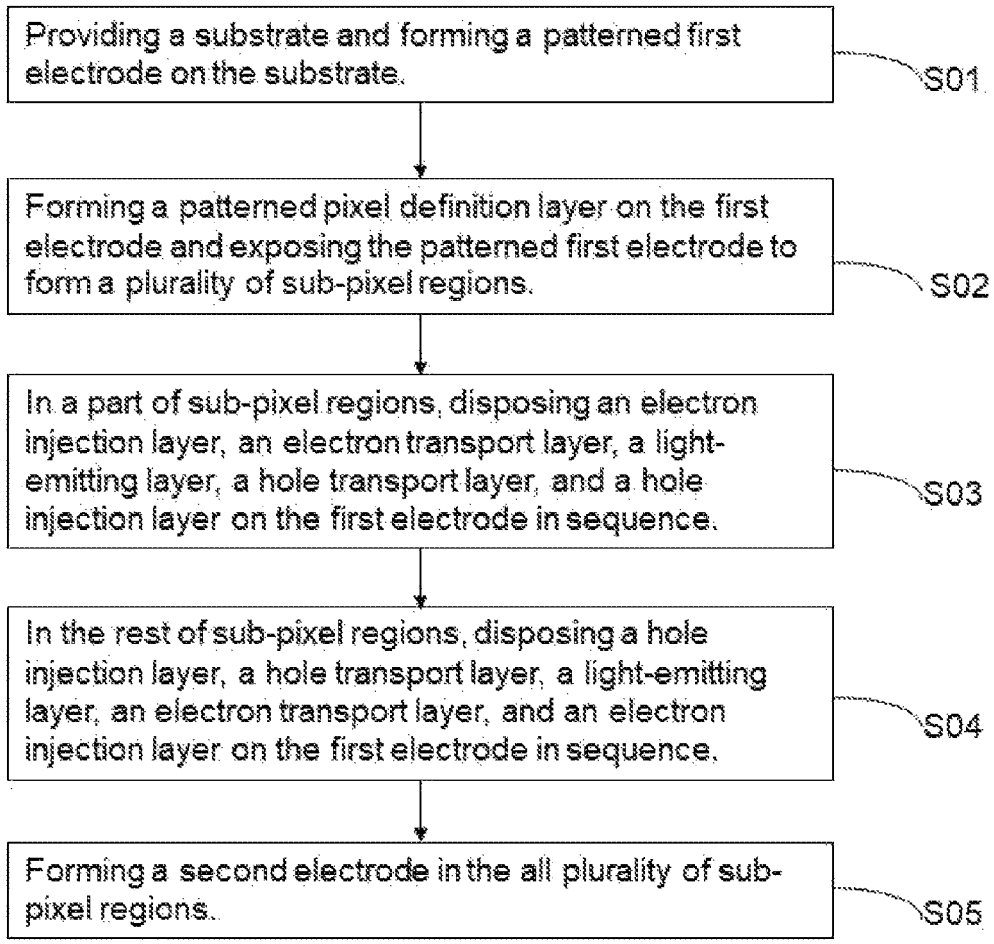
FIG. 2 is a flowchart of a manufacturing method of a display panel according to an embodiment of the present disclosure.

The embodiments of the present disclosure are described in detail hereinafter. Examples of the described embodiments are given in the accompanying drawings. The specific embodiments described with reference to the attached drawings are all exemplary and are intended to illustrate and interpret the present disclosure. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In this disclosure, the word "exemplary" is used to mean "serving as an example, illustration, or description". Any embodiment described as "exemplary" in this disclosure is not necessarily to be construed as a preferred or an advantageous embodiment over other embodiments. In order to enable any person skilled in the art to implement and use the present disclosure, the description is given as follows. In the following description, details are set forth for the purpose of explanation. It should be understood by one of ordinary skill in the art that the present disclosure may be implemented without use of these specific details. In other embodiments, well-known structures and procedures are not described in detail to avoid obscuring the description of the present disclosure with unnecessary details. Accordingly, the present disclosure is not intended to be limited to the embodiments shown, but is to be accorded the widest scope consistent with the principles and features disclosed herein.

An embodiment of the present disclosure provides a display panel. Referring to FIG. 1 for a cross-sectional structure of the display panel. Specifically, the display panel comprises:

a substrate 101, wherein a thin film transistor layer (not shown in the figure) is often disposed on the substrate 101 to drive an upper light-emitting device to achieve display.

A pixel definition layer 103 is disposed on the substrate to form a plurality of sub-pixels arranged in an array, and three sub-pixels A1, A2, A3 are exemplarily shown in FIG. 1 for description.

In the plurality of sub-pixels, a part is face-up sub-pixels, and the rest is flip sub-pixels. That is, the face-up sub-pixels and the flip sub-pixels simultaneously exist in the sub-pixels.

Specifically, the sub-pixel A1 is a flip sub-pixel, and in the sub-pixel A1, a first electrode 102, an electron injection layer 104, an electron transport layer 105, a light-emitting layer 106, a hole transport layer 107, a hole injection layer 108, and a second electrode 109 are disposed on the substrate 101 in sequence.

The sub-pixel A2 and the sub-pixel A3 are face-up sub-pixels, and in the sub-pixel A2 and the sub-pixel A3, the first electrode 102, a hole injection layer 108, a hole transport layer 107, a light-emitting layer 106, an electron transport layer 105, an electron injection layer 104, and the second electrode 109 are disposed on the substrate 101 in sequence.

In the above face-up sub-pixels, the first electrode 102 is used as an anode and a source of holes, and the second electrode 109 is used as a cathode and a source of electrons.

In the flip sub-pixels, the first electrode 102 is used as a cathode and a source of electrons, and the second electrode 109 is used as an anode and a source of holes.

The first electrodes in the face-up sub-pixels and the flip sub-pixels are applied opposite voltages by setting of a drive circuit to achieve the first electrode in the face-up sub-pixels used as an anode and providing holes, and the first electrode in the flip sub-pixels used as a cathode and providing electrons.

In the embodiment, the first electrode is usually made of indium tin oxide.

In the embodiment, in the face-up sub-pixels, the light-emitting layer is made of an organic luminescent material, that is, forming an OLED device; and in the flip sub-pixels, the light-emitting layer is made of a quantum dot luminescent material, that is, forming a QLED device. Because energy levels of QLED device materials in each layer have a greater difference from energy levels of OLED device materials in each layer, disposing the QLED device upside down comparing to the OLED device can effectively improve the problems of a lower device efficiency and a shorter service life caused by greater potential barriers among each material layer in the QLED device.

Further, the plurality of sub-pixels are divided into a plurality of pixels, any one of the pixels comprises at least three sub-pixels, and in the at least three sub-pixels, a part is the face-up sub-pixels and the rest is the flip sub-pixels. That is, a complete pixel region comprises the face-up sub-pixels and the flip sub-pixels at the same time.

Further, any one of the plurality of pixels comprises three sub-pixels. That is, the sub-pixel A1, the sub-pixel A2, and the sub-pixel A3 in FIG. 1 form a complete pixel. In an ordinary situation, the three sub-pixels usually comprise a red sub-pixel, a blue sub-pixel, and a green sub-pixel.

In the red sub-pixel, the blue sub-pixel, and the green sub-pixel, any one of them can be a flip sub-pixel, and the other two can be face-up sub-pixels; or any two of them are flip sub-pixels, and the other one is a face-up sub-pixel. For example, the sub-pixel A1 is a red flip sub-pixel, the sub-pixel A2 is a blue face-up sub-pixel, and the sub-pixel A3 is a green face-up sub-pixel. Other situations are not repeated here.

It should be noted that any one of the plurality of pixels may comprise four sub-pixels which are respectively a red sub-pixel, a blue sub-pixel, a green sub-pixel, and a white sub-pixel. The four sub-pixels comprise the face-up sub-pixels and the flip sub-pixels at the same time. Or any one of the plurality of pixels may comprise other forms of sub-pixels. The embodiment of the present disclosure only requires a complete pixel region including the face-up sub-pixels and the flip sub-pixels at the same time.

Further, the display panel further comprises an optical coupling output layer 110 disposed on the second electrode 109 to improve light extraction efficiency. A thickness of the optical coupling output layer 110 usually ranges from 50 nm to 100 nm.

It should be noted that the above display panel in the embodiment only describes the above structure, and it should be understood that in addition to the above structure, in the display panel of an embodiment of the present disclosure, any other necessary structures can be included according to needs, such as a thin film encapsulation layer, a thin film transistor array layer, a hole blocking layer, and an electron blocking layer, which is not limited herein.

Another embodiment of the present disclosure further provides a manufacturing method of the above display panel. Please refer to FIG. 2 and FIG. 3A to FIG. 3F for the manufacturing processes. Specifically, the method comprises following steps:

S01: providing a substrate 101 and forming a patterned first electrode 102 on the substrate 101. That is, forming the structure shown in FIG. 3A. The first electrode 102 is disposed correspondingly in each sub-pixel region, and is usually formed by using physical vapor deposition to form a whole film layer and then patterning. The first electrode 102 is usually made of indium tin oxide.

S02: forming a patterned pixel definition layer 103 on the first electrode 102 and exposing the patterned first electrode 102 to form a plurality of sub-pixel regions. That is, forming the structure shown in FIG. 3B. Three sub-pixel regions are exemplarily shown in FIG. 3B, and are respectively the sub-pixel A1, the sub-pixel A2, and the sub-pixel A3.

Figure 3A:
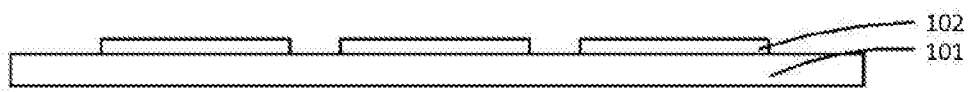
FIG. 3A to FIG. 3F are schematic structural diagrams of a display panel in different steps of a manufacturing method according to an embodiment of the present disclosure.
Figure 3B:
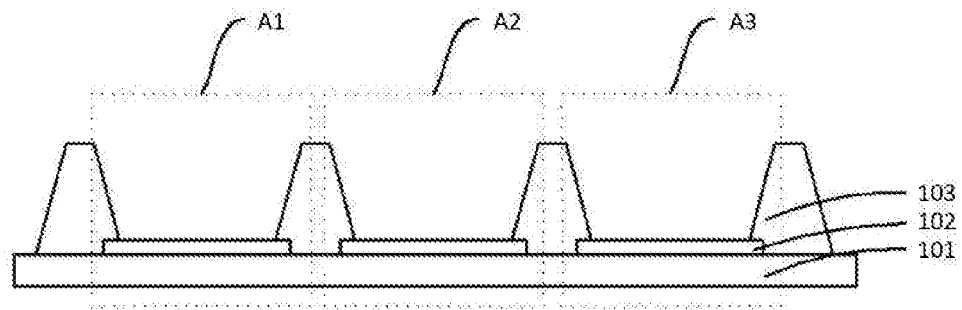
Figure 3C:
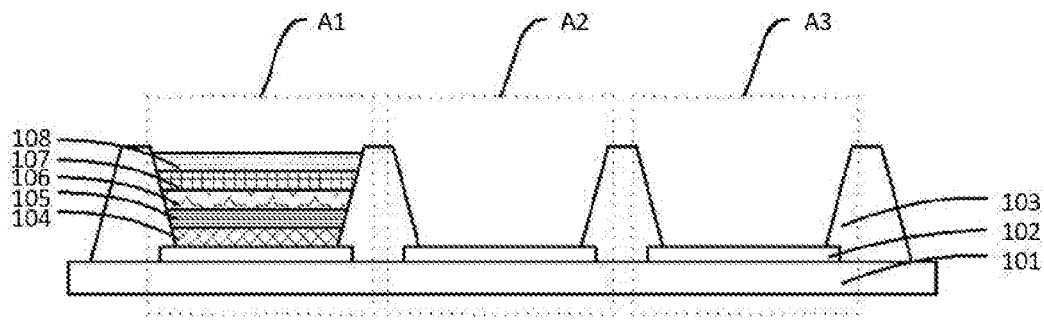

S03: in a part of sub-pixel regions, for example, in the sub-pixel A1, disposing an electron injection layer 104, an electron transport layer 105, a light-emitting layer 106, a hole transport layer 107, and a hole injection layer 108 on the first electrode 102 in sequence to form a flip sub-pixel, the structure shown in FIG. 3C. Wherein, the light-emitting layer 106 is usually made of a quantum dot luminescent material.

Figure 3D:
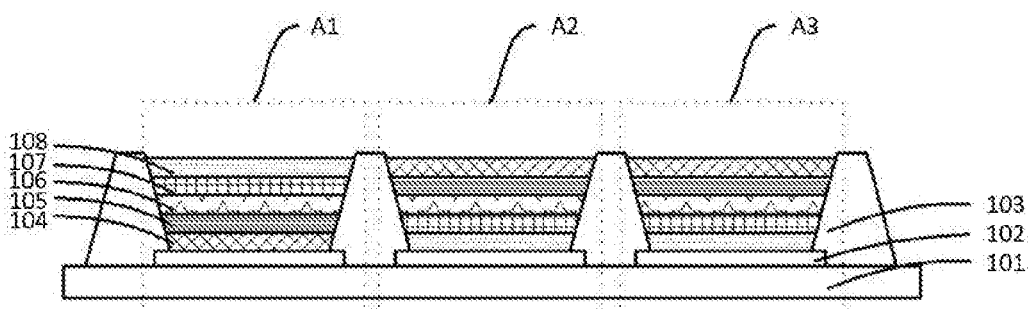
Figure 3E:
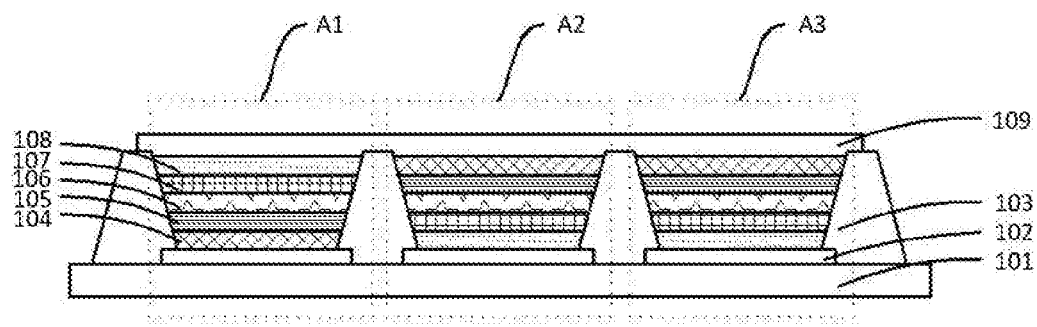

S04: in the rest of sub-pixel regions, for example, in the sub-pixel A2 and the sub-pixel A3, disposing a hole injection layer 108, a hole transport layer 107, a light-emitting layer 106, an electron transport layer 105, and an electron injection layer 104 on the first electrode 102 in sequence to form a face-up sub-pixel, the structure shown in FIG. 3D. Wherein, the light-emitting layer 106 is usually made of an organic luminescent material.

S05: in the plurality of sub-pixel regions, that is, in the sub-pixel region A1, the sub-pixel region A2, and the sub-pixel region A3, disposing a second electrode 109 at the same time. Specifically, in the face-up sub-pixels, the second electrode 109 is disposed on the electron injection layer 104, and in the flip sub-pixels, the second electrode 109 is disposed on the hole injection layer 108, that is, forming the structure shown in FIG. 3E.

Further, in the steps of S03 and S04, the electron injection layers 104, the electron transport layers 105, the light-emitting layers 106, the hole transport layers 107, and the hole injection layers 108 are formed by inkjet printing. It can save the process cost compared to current widely used process: fine masks plus vacuum vapor deposition process.

In the step S05, the second electrode 109 is usually formed by vacuum vapor deposition, and a thickness of the second electrode 109 usually ranges from 10 nm to 200 nm.

Figure 3F:
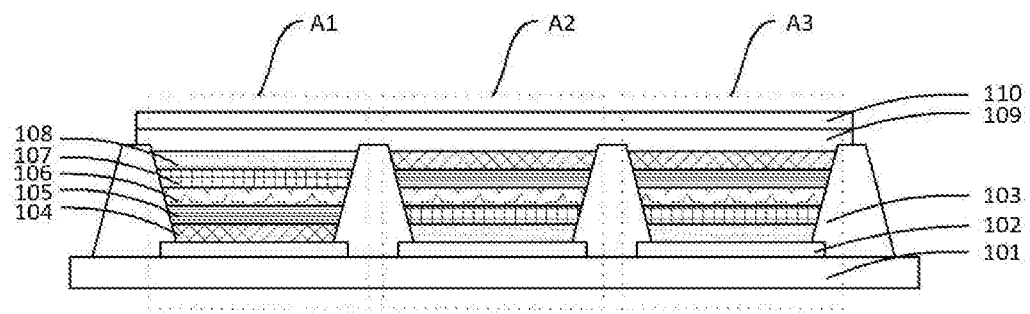

Further, an optical coupling output layer 110 can be formed on the second electrode 109 by vacuum vapor deposition, that is, forming the structure shown in FIG. 3F. A thickness of the optical coupling output layer 110 usually ranges from 50 nm to 100 nm, and the optical coupling output layer 110 is used to improve light extraction efficiency of each sub-pixel.

Another embodiment of the present disclosure further provides a display device which comprises the above display panel.

In the above embodiments, the description of each embodiment has its own emphasis. For the parts that are not described in detail in an embodiment, refer to the detailed description of other embodiments above, which will not be repeated here.

The display panel, the manufacturing method thereof, and the display device provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising a substrate, wherein a pixel definition layer is disposed on the substrate to define a plurality of sub-pixels arranged in an array, and in the plurality of sub-pixels, a part is face-up sub-pixels, and the rest is flip sub-pixels;

wherein in the face-up sub-pixels, a first electrode, a hole injection layer, a hole transport layer, a light-emitting layer, an electron transport layer, an electron injection layer, and a second electrode are disposed on the substrate in sequence, and in the flip sub-pixels, the first electrode, an electron injection layer, an electron transport layer, a light-emitting layer, a hole transport layer, a hole injection layer, and the second electrode are disposed on the substrate in sequence.

2. The display panel according to claim 1, wherein in the face-up sub-pixels, the light-emitting layer is made of an organic luminescent material, and in the flip sub-pixels, the light-emitting layer is made of a quantum dot luminescent material.

3. The display panel according to claim 1, wherein in the face-up sub-pixels, the first electrode is an anode and the second electrode is a cathode, and in the flip sub-pixels, the first electrode is a cathode, and the second electrode is an anode.

4. The display panel according to claim 1, wherein the plurality of sub-pixels are divided into a plurality of pixels, any one of the pixels comprises at least three sub-pixels, and in the at least three sub-pixels, a part is the face-up sub-pixels and the rest is the flip sub-pixels.

5. The display panel according to claim 4, wherein any one of the pixels comprises a red sub-pixel, a blue sub-pixel, and a green sub-pixel.

6. The display panel according to claim 5, wherein any one of the red sub-pixel, the blue sub-pixel, and the green sub-pixel is a face-up sub-pixel, and the other two are flip sub-pixels; or any two of the red sub-pixel, the blue sub-pixel, and the green sub-pixel are face-up sub-pixels, and the other one is a flip sub-pixel.

7. The display panel according to claim 1, comprises an optical coupling output layer disposed on the second electrode.

8. The display panel according to claim 7, wherein a thickness of the optical coupling output layer ranges from 50 nm to 100 nm.

9. The display panel according to claim 1, wherein the first electrode is made of indium tin oxide.

10. A display device, comprising the display panel according to claim 1.

11. A manufacturing method of a display panel, comprising:
    S01: providing a substrate and forming a patterned first electrode on the substrate;
    S02: forming a patterned pixel definition layer on the first electrode and exposing the patterned first electrode to form a plurality of sub-pixel regions;
    S03: in a part of sub-pixel regions, disposing an electron injection layer, an electron transport layer, a light-emitting layer, a hole transport layer, and a hole injection layer on the first electrode in sequence;
    S04: in the rest of sub-pixel regions, disposing a hole injection layer, a hole transport layer, a light-emitting layer, an electron transport layer, and an electron injection layer on the first electrode in sequence;
    S05: forming a second electrode in the plurality of sub-pixel regions together.

12. The manufacturing method of the display panel according to claim 11, wherein the hole injection layers, the hole transport layers, the light-emitting layers, the electron transport layers, and the electron injection layers are formed by inkjet printing.

13. The manufacturing method of the display panel according to claim 11, wherein the second electrode is formed by vacuum vapor deposition.

14. The manufacturing method of the display panel according to claim 11, wherein an optical coupling output layer is formed on the second electrode by vacuum vapor deposition.

15. The manufacturing method of the display panel according to claim 11, wherein in the step S03, the light-emitting layer is made of a quantum dot luminescent material, and in the step S04, the light-emitting layer is made of an organic luminescent material.

* * * * *